United States Patent
Pharand et al.

(10) Patent No.: US 7,026,581 B2
(45) Date of Patent: Apr. 11, 2006

(54) APPARATUS FOR POSITIONING AN ELEVATOR TUBE

(75) Inventors: Michel Pharand, Chelmsford, MA (US); Thomas L. Durant, Reading, MA (US); Ari Eiriksson, Brighton, MA (US); Richard Gueler, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 209 days.

(21) Appl. No.: 10/646,228

(22) Filed: Aug. 22, 2003

(65) Prior Publication Data

US 2005/0042807 A1    Feb. 24, 2005

(51) Int. Cl.
*F27B 5/14*   (2006.01)
*F27D 11/00*   (2006.01)

(52) U.S. Cl. ............... 219/392; 219/390; 118/724; 118/725; 392/416; 392/418

(58) Field of Classification Search ............ 219/390, 219/392, 405, 411, 416, 418; 118/50.1, 724, 118/725; 392/416, 418
See application file for complete search history.

(56) References Cited

U.S. PATENT DOCUMENTS

| | | | |
|---|---|---|---|
| 4,530,635 A * | 7/1985 | Engelbrecht et al. ....... | 414/627 |
| 4,857,689 A | 8/1989 | Lee | |
| 4,952,299 A | 8/1990 | Chrisos et al. | |
| 5,148,714 A * | 9/1992 | McDiarmid .................. | 74/89.4 |
| 5,356,476 A * | 10/1994 | Foster et al. ................. | 118/725 |
| 5,443,648 A * | 8/1995 | Ohkase ........................ | 118/724 |
| 5,730,801 A * | 3/1998 | Tepman et al. .............. | 118/719 |
| 5,772,773 A * | 6/1998 | Wytman ...................... | 118/729 |
| 5,897,380 A * | 4/1999 | White et al. ................. | 438/780 |
| 5,900,177 A | 5/1999 | Lecouras et al. | |
| 5,903,711 A * | 5/1999 | Okase .......................... | 392/418 |
| 6,111,225 A * | 8/2000 | Ohkase et al. .............. | 219/390 |
| 6,183,565 B1 | 2/2001 | Granneman et al. | |
| 6,408,767 B1 | 6/2002 | Binnard et al. | |
| 6,610,968 B1 * | 8/2003 | Shajii et al. ................. | 219/497 |
| 6,753,506 B1 * | 6/2004 | Liu et al. ..................... | 219/390 |
| 6,855,916 B1 * | 2/2005 | Matthews et al. ........... | 219/390 |
| 2003/0217929 A1 * | 11/2003 | Peace .......................... | 205/148 |
| 2003/0224295 A1 * | 12/2003 | Heerens et al. ............. | 430/311 |
| 2003/0230854 A1 * | 12/2003 | Kim ............................ | 277/549 |

* cited by examiner

*Primary Examiner*—James M. Hewitt
(74) *Attorney, Agent, or Firm*—Watts Hoffmann Co., L.P.A.

(57) ABSTRACT

A wafer support position control mechanism selectively positions a semiconductor wafer along an axis of excursion within a process chamber. An elevator tube protrudes through an orifice in the chamber surface and is connected at a first distal end to the wafer support. A compliant, dynamic seal within the orifice engages the elevator tube to form a gas curtain within a gap between the seal and the elevator tube to seal the process chamber. A moveable carriage is connected to the elevator tube at a second distal end for moving the wafer support along the axis of excursion. Rigid mechanical structure couples the second distal end of the elevator tube to the moveable carriage.

5 Claims, 3 Drawing Sheets

APPARATUS FOR POSITIONING AN ELEVATOR TUBE

TECHNICAL FIELD

The present invention relates generally to the field of semiconductor thermal processing systems, and more specifically to a vertical rapid thermal processing unit that includes an elevator assembly for positioning a wafer within the processing unit.

BACKGROUND OF THE INVENTION

Thermal processing systems are widely used in various stages of semiconductor fabrication. Basic thermal processing applications include chemical deposition, diffusion, oxidation, annealing, silicidation, nitridation, and solder re-flow processes. Vertical rapid thermal processing (RTP) systems comprise a vertically oriented processing chamber which is heated by a heat source such as a resistive heating element or a bank of high intensity light sources. An elevator structure is controlled to move a wafer on a wafer support vertically within the processing chamber. In some RTP systems, the heat sources create a temperature gradient within the processing chamber and temperature ramp-up and ramp-down rates of the wafer being processed are controlled by the vertical location of the wafer within the processing chamber. Therefore, to optimize the thermal processing of semiconductor wafers it is important to accurately control the position of the wafer within the processing chamber.

Because of the length of the moving elevator structure it must be held rigidly at its base in order to obtain maximum mechanical rigidity, thereby minimizing in plane vibration that may be imparted to the wafer. The vibrations may cause the wafer to move relative to the support, thereby losing concentricity with the support structure. Lack of concentricity results in temperature non-uniformity near the wafer perimeter.

Semiconductor thermal processing must be performed in an environment that is relatively free of contamination. For this reason, the processing chamber is pressurized to protect against contamination from the ambient air in the manufacturing environment. The orifice through which a quartz elevator tube protrudes to support the wafer includes a bearing whose surface co acts with the elevator tube to define a gas curtain made up of chamber gas escaping the chamber and pressurized gas fed to the bearing. The gas curtain also reduces the lateral motion of the elevator tube as it moves vertically within the chamber. To minimize contamination, it is desirable to maintain low clearance between the bearing surface in the chamber orifice and the elevator tube. Another advantage of lower clearance is that it enhances the centering capability of the gas curtain by increasing the pressure drop along the tube axis for a given flow rate of gas within the gas curtain. However, low clearance between the bearing and the elevator tube increases the possibility that the elevator tube will contact the bearing and pick up contaminants from the bearing that may be carried into the processing chamber.

SUMMARY OF THE INVENTION

A compliant, dynamic coupling for preventing the flow of gas into a pressurized chamber into which a rod extends through a chamber orifice and moves axially within the chamber. A bearing is mounted within the orifice and is disposed concentrically about the rod. An inner bearing surface is in close proximity to an outer surface of the rod. A gas port supplies pressurized gas into a gas curtain defined by the gas flow between the rod and the inner bearing surface. A compliant member is adjacent to the bearing for absorbing a force created when the rod moves into contact with the inner bearing surface to reduce contact forces created when the rod contacts the inner bearing surface. In an exemplary embodiment, the compliant member is a bellows, preferably made of metal.

An elevator tube positioning system for moving a wafer support within a process chamber features an elevator tube rigidly mounted at its base to a moveable carriage and protruding through an orifice into a process chamber. A gas curtain is established between the orifice and outer tube diameter to prevent incursion of ambient air into the chamber. A compliant, dynamic seal within the orifice engages the outer diameter of the tube to stabilize the tube's lateral position.

DETAILED DESCRIPTION OF THE PREFERRED EMBODIMENT

Figure 1:
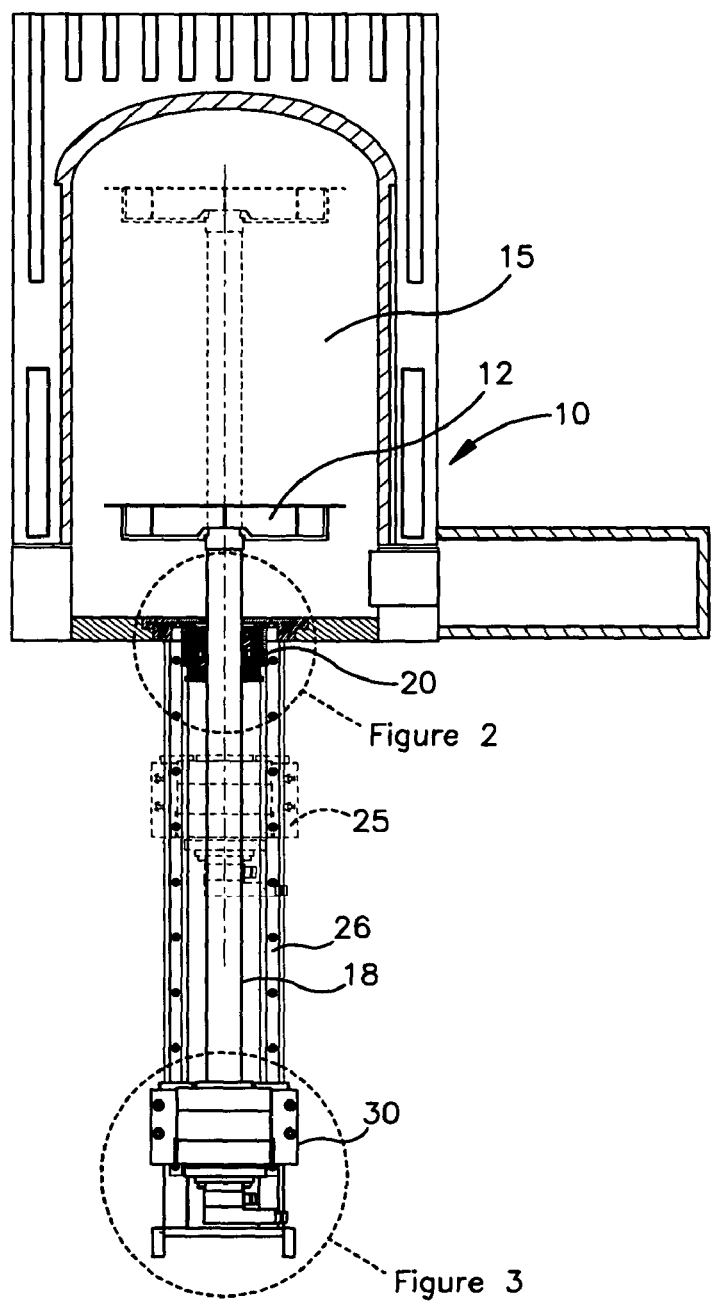
FIG. 1 is a front cross section view of a rapid thermal processing unit including an elevator tube position control mechanism in accordance with an embodiment of the present invention.

FIG. 1 illustrates a rapid thermal processing system 10 that uses a cylindrical hot wall system to thermally process semiconductor wafers. A wafer (not shown) is placed on a wafer support indicated generally as reference numeral 12. The wafer is moved vertically through a process chamber having a temperature gradient created by heating elements behind the chamber walls. The wafer support 12 is connected to an elevator tube assembly 18 that protrudes through an orifice in the chamber floor. The elevator tube is connected via a pair of flexures indicated generally as 30 (shown separately as 35, 38 in FIG. 4) to a moveable carriage having a base support 39 (FIG. 4) that traverses a set of rails 26 to move the elevator tube 18 and wafer support 12 along a vertical excursion within the process chamber 15.

A bearing assembly 20 surrounds the elevator tube at the bottom of the process chamber and provides a compliant, dynamic coupling between the tube and the chamber that minimizes process gas leakage and aligns the elevator tube within the orifice in the chamber floor. Gas is supplied within the bearing to form a gas curtain and to restrict the flow of ambient air into the chamber through the gap between the elevator tube outer diameter and the orifice.

Figure 4:
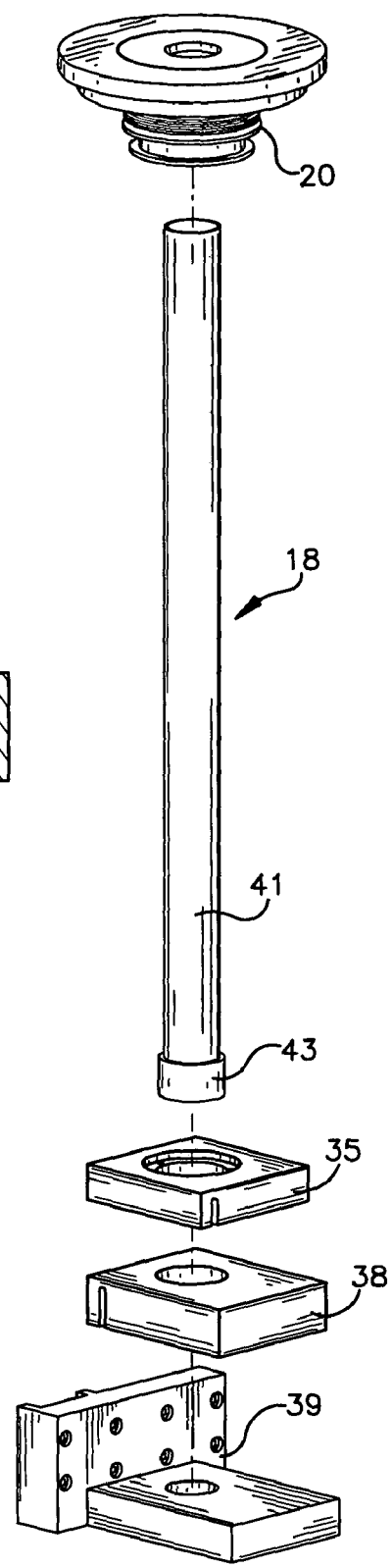
FIG. 4 is a perspective view of the elevator tube assembly shown as part of the rapid thermal processing unit of FIG. 1.

Referring now to FIG. 4, an exploded view of the elevator tube assembly is shown. An elevator tube 41 is made from quartz to prevent metallic contamination within the process chamber 15. In order to maximize the mechanical stiffness of the tube a flange 43 is fused at the base of the tube in order to fix the base and to co act with a set of first and second flexures 35, 38 to add mechanical stiffness to the quartz tube. By providing increased mechanical stiffness to the quartz tube, wafer displacement can be minimized thereby providing a more uniform temperature on the wafer surface.

Figure 3:
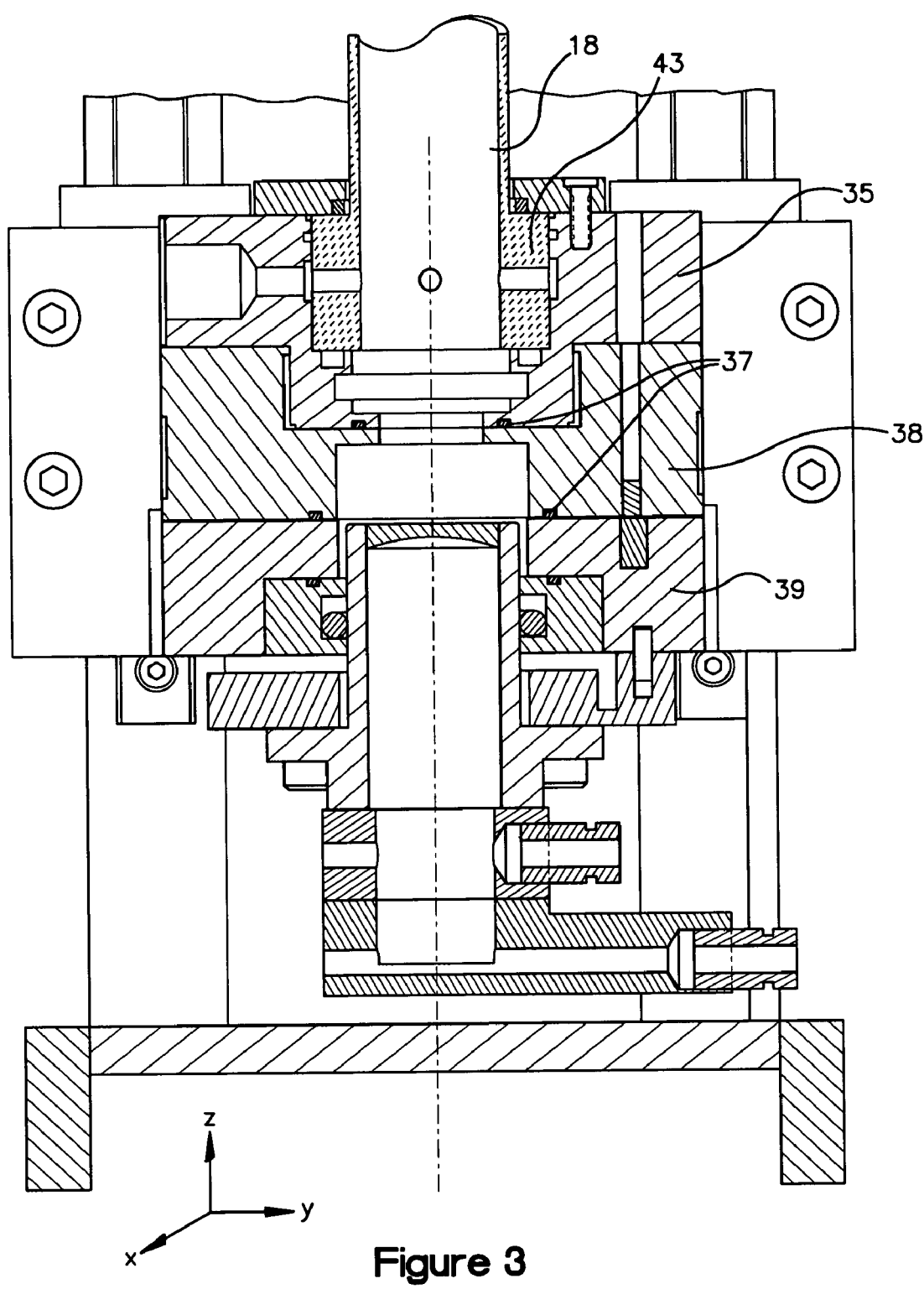
FIG. 3 is an enlarged cross section view of the elevator tube as it is mounted to the elevator carriage in the rapid thermal processing unit of FIG. 1.

Referring to FIG. 3, the flexures 35, 38 are fixed to a base support 39 on the moveable carriage. The bottom flexure 38 is mounted normal to the rail surface 26 via the base support attachment 39. The flexure 38 is fastened to the base support 39, whereby a tilt adjustment is provided by a spring like mechanism built within the component. By adjusting a set screw the tube structure can pivot about the anchoring point. Similarly, the top flexure 35 is also the mounting surface for the quartz tube 41 and 43. The top flexure is also adjusted with a spring like mechanism using a setscrew. The combination of both flexures allows the quartz tube to rotate about two axes. Because of the gas flow through the quartz tube at the tube base support 39, both flexures 35 and 38 have seals 37 mounted between to prevent gas leaks. The flexure motion is limited and therefore impedes the gas flow to leak to atmosphere. The flexures 35, 38 are adjusted and set in a fixed position each time the quartz tube 41 is changed. While the flexures control tube rotation about the x and y axis as shown in the coordinate system of FIG. 3 to make the centerline of the tube parallel with the rails (FIG. 4) additional means are required to maintain the lateral position of the quartz tube 41 as it makes its vertical excursion relative to the process chamber.

Figure 2:
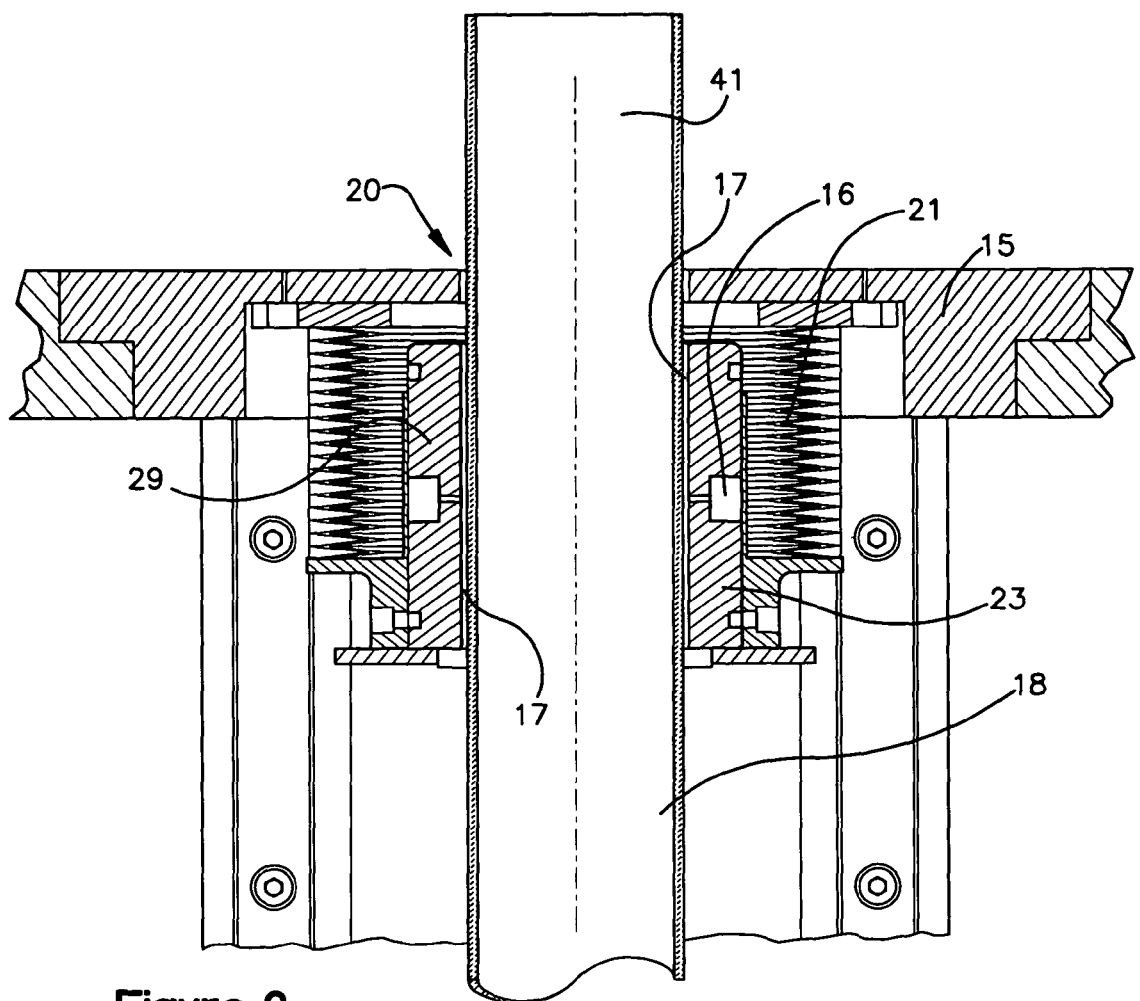
FIG. 2 is an enlarged cross section view of the gas curtain shown as part of the rapid thermal processing unit of FIG. 1.
Figure 2A:
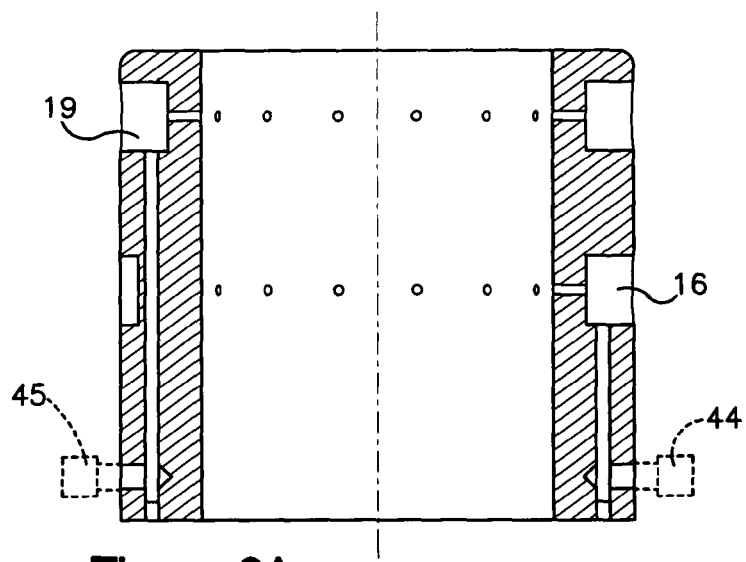
FIG. 2A is an enlarged view of a portion of the gas curtain view shown in FIG. 2.

FIGS. 2 and 2A illustrate a gas curtain and compliant, dynamic seal indicated generally as 20 that prevent the incursion of ambient air into the chamber as well as preventing contact between the quartz tube 41 and an inner surface of a metal or ceramic bearing 29. The region 17 between the outer diameter of the quartz tube 41 and the orifice in the floor of the chamber 15 defines a gas curtain. To form the gas curtain, gas from a gas supply (not shown) is directed through an inlet port 44 and flows through a concentric ring of inlet orifices 16 into a gas curtain region 17 that is the gap between the outer surface of the rod 18 and the bearing 29. The supplied gas flows upward from each inlet orifice 16 to an exhaust orifice 19 and downward to escape through the bottom of the gas cushion region 17. The amount of gas that escapes the bearing is minimized by connecting the exhaust orifice 19 to a vacuum source via exhaust port 45 so that the majority of the gas flowing through inlet orifices 16 will tend to flow to the exhaust orifices 19.

A ring shaped bellows 21 is concentric with the orifice 17 and the bearing 29 and is in contact with the bearing 29. The bellows 21 thus adds compliance to the gas curtain. When the quartz tube 41 moves laterally with respect to the centerline of the orifice 17 during its excursion, the tube pushes against the metallic bearing 29, causing pressure variations within the gas curtain due to uneven restriction of the flow entering the gas curtain through the small holes of port 16. The bellows 21 deflects laterally in response and absorbs the force of the tube while allowing the gas curtain pressure to actively center itself with respect to the quartz tube. In this manner, the lateral movement of the quartz tube 41 relative to the metal bearing is limited to reduce contact forces between the tube and the metallic bearing 29.

As can be seen from the foregoing description, an elevator tube assembly that is mechanically fixed at its base and contained laterally within a dynamic, compliant seal at its entry to the process chamber reduces vibration experienced by the wafer during thermal processing. Although the present invention has been described with a degree of particularity, it is the intent that the invention include all modifications and alterations from the disclosed design falling within the spirit or scope of the appended claims.

We claim:

1. A compliant, dynamic coupling for preventing the flow of gas into a pressurized chamber, wherein a rod extends into the chamber through a chamber orifice and moves axially within the chamber, the coupling comprising:
    a bearing mounted within the orifice and disposed concentrically about the rod, the bearing comprising an inner bearing surface that is in close proximity to an outer surface of the rod;
    a gas port for supplying pressurized gas into a gas curtain defined by the gas flow between the rod and the inner bearing surface; and
    a compliant member adjacent the bearing for absorbing a force created when the rod moves toward the inner bearing surface to reduce contact forces created when the rod contacts the inner bearing surface.

2. The compliant, dynamic coupling of claim 1 wherein the compliant member is a bellows that is disposed concentrically about the bearing.

3. An apparatus for selectively positioning a semiconductor wafer along an axis of excursion within a process chamber having a chamber surface that is perpendicular to the axis, the apparatus comprising:
    a wafer support situated within the process chamber for supporting at least one semiconductor wafer as it is moved within the chamber;
    an elevator tube that protrudes through an orifice in the chamber surface and is connected at a first distal end to the wafer support;
    a compliant, dynamic coupling within the orifice that coacts with the elevator tube to define a gas curtain region the coupling comprising:
    a bearing mounted within the orifice and disposed concentrically about the elevator tube, the bearing comprising an inner bearing surface that is in close proximity to an outer surface of the elevator tube and wherein the inner bearing surface and the outer surface of the elevator tube define the gas curtain region;
    a gas port for supplying pressurized gas into the gas curtain region to create a gas curtain defined by the gas flow between the elevator tube and the inner bearing surface; and
    a compliant member adjacent the bearing for absorbing a force created when the elevator tube moves toward the inner bearing surface to reduce contact forces created when the elevator tube contacts the inner bearing surface;
    a moveable carriage connected to the elevator tube at a second distal end for moving the wafer support along the axis of excursion; and
    mounting structure for coupling the second distal end to the carriage.

4. The apparatus of claim 3 wherein the compliant member comprises a bellows assembly concentric with the orifice.

5. The apparatus of claim 3 wherein the mounting structure is a plurality of flexures, wherein each flexure fixes the elevator tube about a given axis of rotation.

* * * * *